(12) United States Patent
Hwang (10) Patent No.: US 6,559,707 B1
(45) Date of Patent: May 6, 2003

(54) BOOTSTRAP CIRCUIT

(75) Inventor: Tae Sun Hwang, Gwachon-Shi (KR)

(73) Assignee: Hynix Semiconductor Inc., Kyungki-do (KR)

( * ) Notice: Subject to any disclaimer, the term of this patent is extended or adjusted under 35 U.S.C. 154(b) by 0 days.

(21) Appl. No.: 10/026,671

(22) Filed: Dec. 27, 2001

(30) Foreign Application Priority Data

Dec. 6, 2001 (KR) ........................................ 2001-76912

(51) Int. Cl.[7] .............................................. H03K 17/16
(52) U.S. Cl. ...................................................... 327/390
(58) Field of Search ................................ 327/390, 530, 327/534, 535, 536

(56) References Cited

U.S. PATENT DOCUMENTS

| | | | |
|---|---|---|---|
| 5,317,538 A | 5/1994 | Eaton, Jr. | 365/189.09 |
| 5,909,141 A * | 6/1999 | Tomishima | 327/534 |
| 6,205,079 B1 * | 3/2001 | Namekawa | 327/536 |
| 6,208,197 B1 * | 3/2001 | Ternullo et al. | 327/390 |
| 6,229,740 B1 * | 5/2001 | Ogura | 327/390 |
| 6,370,075 B1 * | 4/2002 | Haeberli et al. | 327/536 |

FOREIGN PATENT DOCUMENTS

| | | |
|---|---|---|
| DE | 36 14 421 C2 | 7/1991 |
| DE | 43 43 284 C2 | 2/1998 |
| DE | 43 31 895 C2 | 11/1998 |
| DE | 695 16 328 T2 | 9/2000 |
| EP | 0 811 980 A2 | 12/1997 |

* cited by examiner

*Primary Examiner*—Jeffrey Zweizig
(74) *Attorney, Agent, or Firm*—Morgan, Lewis and Bockius LLP (57) ABSTRACT

The present invention relates to a bootstrap circuit. The present invention stably perform a read operation of a flash memory cell by constructing the bootstrap circuit to be clamped only at a high potential voltage 'HVcc' and to be normally operated at a low potential voltage source 'LVcc' to easily control on a word line boosting voltage, by sensing the high potential voltage source 'HVcc' and the low potential voltage source 'LVcc'.

19 Claims, 9 Drawing Sheets

BOOTSTRAP CIRCUIT

BACKGROUND OF THE INVENTION

1. Field of the Invention

The invention relates generally to a bootstrap circuit, and more particularly to, a word line bootstrap circuit for implementing a high-speed flash memory and a memory cell having a good data holding capability.

2. Description of the Prior Art

Generally, in order to increase the speed of a read operation in a flash memory cell driven with a low voltage upon a read operation, a low potential supply voltage (LOW Vcc; LVcc) is bootstrapped using a bootstrap circuit to supply the bootstrapped voltage to a word line.

In case that the bootstrap circuit is used to boost the word line voltage, there is a problem of a retention since it is difficult to exactly read the cell current if the word line voltage boosted by the bootstrap circuit is too low and stress is applied to the cell gate if the word line voltage is too high. Therefore, the word line voltage boosted by the bootstrap circuit must be boosted within a given range of voltage.

Figure 1:
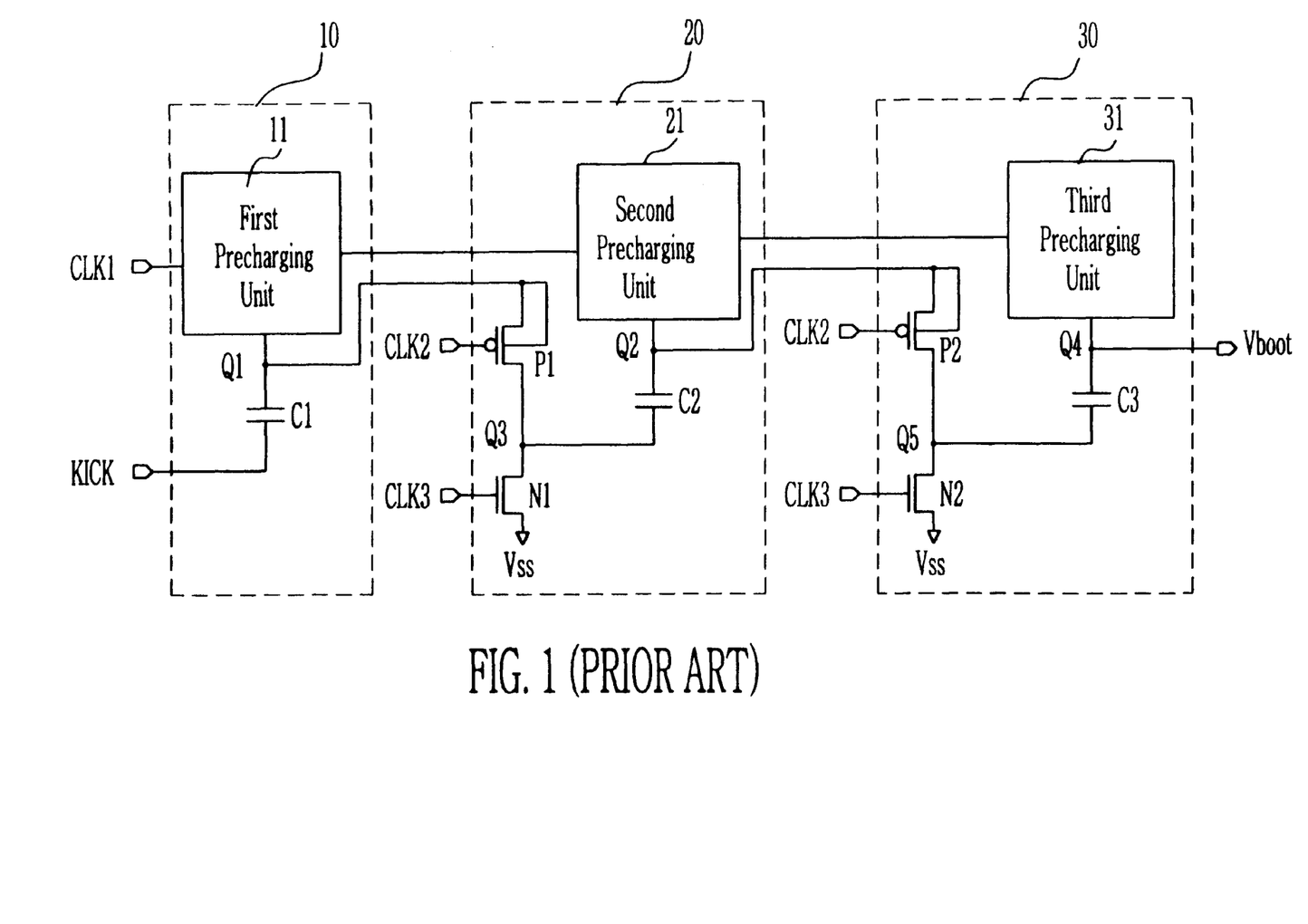
FIG. 1 is a construction of a conventional bootstrap circuit.

Referring now to FIG. 1, a construction of a conventional word line bootstrap circuit will be below explained.

The conventional word line bootstrap circuit includes a first stage 10~third stage 30 for pumping the supply voltage 'Vcc' applied to the word line over three steps.

The first stage 10 includes a first precharging unit 11 for precharging a first node Q1 with a given potential 'Vcc' or 'Vcc−Vt' depending on a first clock signal CLK1, and a first capacitor C1 for pumping the first node Q1 with a first potential 'V1' depending on a kick signal KICK.

The second stage 20 includes a second precharging unit 21 for precharging a second node Q2 with a given potential 'Vcc' or 'Vcc−Vt' depending on the first clock signal CLK1, a first PMOS transistor P1 connected between the first node Q1 and the third node Q3 and driven by a second clock signal CLK2, a first NMOS transistor N1 connected between the third node Q3 and the ground Vss and driven by a third clock signal CLK3, and a second capacitor C2 connected between the second node Q2 and the third node Q3, for pumping the second node Q2 with a second potential 'V2'.

The third stage 30 includes a third precharging unit 31 for precharging a fourth node Q4 with a given potential 'Vcc' or 'Vcc−Vt' depending on the first clock signal CLK1, a second PMOS transistor P2 connected between the second node Q2 and the fifth node Q5 and driven by the second clock signal CLK2, a second NMOS transistor N2 connected between a fifth node Q5 and the ground Vss and driven by the third clock signal CLK3, and a third capacitor C3 connected between the fourth node Q4 and the fifth node Q5, for pumping the fourth node Q4 with the third potential 'V3'.

Figure 2:
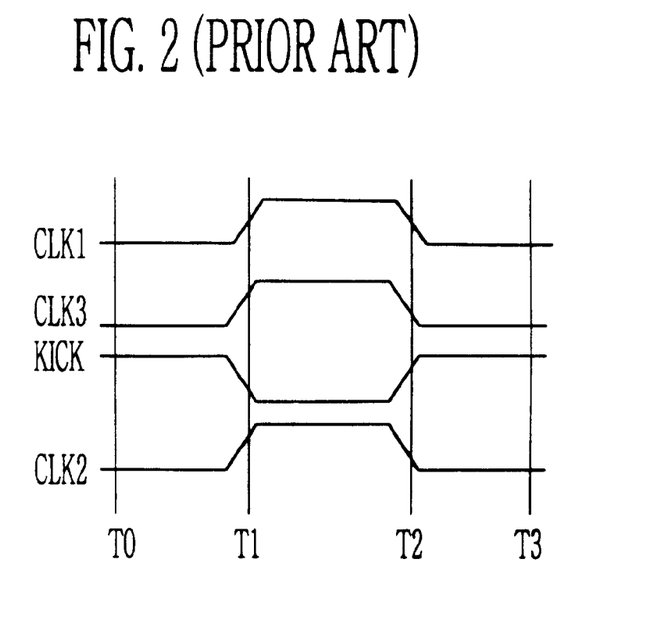
FIG. 2 a waveform of each of signals inputted to drive the bootstrap circuit in FIG. 1.

A method of driving the conventional word line bootstrap circuit constructed as above will be below described by reference to FIG. 2 showing a waveform of each of signal inputted respective stages.

Referring now to FIG. 2, during period from a first time T0 to a second time T1, the first, the second and third clock signals CLK1, CLK2 and CLK3 are kept at a LOW state and the kick signal KICK are kept to be at HIGH state.

In this state, at the second time T1, if the first, second and third clock signals CLK1, CLK2 and CLK3 are shifted from a LOW state to a HIHG state and the kick signal KICK is shifted from a HIGH state to a LOW state, in a positive edge period where the state is changed to a HIGH state, the first, the second and third pre-charging units 11, 21 and 31 are driven by the first clock signal CLK1, the first and second PMOS transistors P1 and P2 are turned off by the second clock signal CLK2 and the first and second NMOS transistors N1 and N2 are turned on by the third clock signal CLK3.

Therefore, a current path is formed between the first precharging unit 11 and a source of the kick signal KICK to pre-charge the first pre-charging unit 11 with the supply voltage 'Vcc' outputted from the first capacitor C1, so that the first node Q1 is precharged with the potential of the supply voltage 'Vcc'. Also, a current path is formed between the second precharging unit 21 and the ground Vss through the first NMOS transistor N1 to precharge the second capacitor C2 with the supply voltage 'Vcc' outputted from the second precharging unit 21, so that the second node Q2 is precharged with the potential of the supply voltage 'Vcc'. Also, a current path is formed between the third precharging unit 31 and the ground Vss through the second NMOS transistor N2 to precharge the third capacitor C3 with the supply voltage 'Vcc' outputted from the third precharging unit 31, so that the fourth node Q4 is precharged with the potential of the supply voltage 'Vcc'.

In a period from the second time T1 to a third time T2, the first, the second and the third clock signals CLK1, CLK2 and CLK3 are kept at a HIGH state the kick signal KICK is kept at a LOW state. Thus, the potential of the first node Q1, the second node Q2 and the fourth node Q4 maintain the potential of the supply voltage 'Vcc'.

In this state, at third time T2, if the first, the second and third clock signals CLK1, CLK2 and CLK3 are shifted from a HIGH state to a LOW state and the kick signal KICK is shifted from a LOW state to a HIGH state, in a negative edge period where the state is changed to a LOW state, the first, the second and the third pre-charging units 11, 21 and 31 are not driven by the first clock signal CLK1, the first and second PMOS transistors P1 and P2 are turned on by the second clock signal CLK2, and the first and second NMOS transistors N1 and N2 are turned off by the third clock signal CLK3.

Therefore, the first potential 'V1' on the first node Q1 is increased by a potential corresponding to the kick signal KICK. For example, if the potential of the kick signal KICK is 'Vcc' same to the supply voltage 'Vcc', the first potential 'V1' is increased by '2Vcc'. Then, the second potential 'V2' on the second node Q2 is increased by '3Vcc' since the first potential 'V1' is transmitted through the first PMOS transistor P1 that was turned on by the second clock signal CLK2. Also, the third potential 'V3' on the fourth node Q4 is increased by '4Vcc' since the second potential V2 is transmitted through the second PMOS transistor P2 that was turned on by the second clock signal CLK2. Therefore, a boosting voltage Vboot outputted to an output terminal of a final word line bootstrap circuit is increased by '4Vcc'.

As described above, the boosting voltage Vboot outputted to the output terminal of the conventional word line bootstrap circuit can be represented by a following Equation 1.

$$Vboot = \alpha V2 + Vcc = \alpha(\alpha V1 + Vcc) + Vcc = \alpha\{\alpha(\alpha Vcc + Vcc) + Vcc\} + Vcc = \alpha\{\alpha^2 Vcc + \alpha Vcc + Vcc\} + Vcc = \alpha^3 Vcc + \alpha^2 Vcc + \alpha Vcc + Vcc = (\alpha^3 + \alpha^2 + \alpha + 1)Vcc \quad \text{[Equation 1]}$$

where 'α' is the coupling ratio of capacitors in respective stages.

If the coupling ratio 'α' of capacitors constituting respective stages is "1", the boosting voltage Vboot is 4Vcc according to Equation 1. At this time, what the coupling ratio 'α' is "1" means that the capacitor transmits 100% boosting voltage Vboot. Generally, the coupling ratio 'α' of a capacitor is about 0.6~0.7(60~70%).

In other words, as represented in Equation 1, a problem in the conventional word line bootstrap circuit is that if the coupling ratio 'α' of the capacitor is determined, the boosting voltage Vboot is changed in proportion to Vcc. For example, in a Vcc operation of 1.6~2V, the sum of the coupling ratio 'α' of a capacitor constituting all the stages is "3" (i.e., ($\alpha^3+\alpha^2+\alpha+1$)=3)), the voltage range of the boosting voltage Vboot is increased to 4.8~6V.

In other words, a target specification of a general word line voltage is swung in the range of 1V. However, the swing range in the boosting voltage Vboot of the conventional word line bootstrap circuit goes beyond the target specification of the word line voltage. Due to this, a margin of the word line voltage could not secured and a general target specification range could not be also secured. In addition, in a high potential supply voltage (HIGH Vcc; HVcc) flash memory cell, a conventional word line bootstrap circuit can be applied by forming the coupling ratio of a capacitor to be small. Even in this case, a margin of the word line voltage could not be secured and a read operation could not be stably performed.

SUMMARY OF THE INVENTION

The present invention is contrived to solve the above problems and an object of the present invention is to stably perform a read operation of a flash memory cell in which a bootstrap circuit is constructed to be clamped only at a high potential voltage 'HVcc' and to be normally operated at a low potential voltage source 'LVcc' to easily control on a word line boosting voltage, by sensing the high potential voltage source 'HVcc' and the low potential voltage source 'LVcc'.

In order to accomplish the above object, a boosting voltage generator according to the present invention is characterized in that it comprises a supply voltage level detection unit for detecting a high potential supply voltage and a potential supply voltage using a reference voltage; and a boosting voltage generator for controlling the level of a boosting voltage depending on a clamp signal generated by an output signal of the supply voltage level detection unit.

Also, a boosting voltage generator according to the present invention is characterized in that it comprises a supply voltage level detection unit for detecting a high potential supply voltage and a potential supply voltage using a reference voltage; and a clamp signal generating unit for generating a clamp signal depending on an output signal of the supply voltage level detection unit; and a boosting voltage generator for controlling the level of a boosting voltage depending on the clamp signal.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF PREFERRED EMBODIMENTS

The present invention will be described in detail by way of a preferred embodiment with reference to accompanying drawings, in which like reference numerals are used to identify the same or similar parts.

Figure 3:
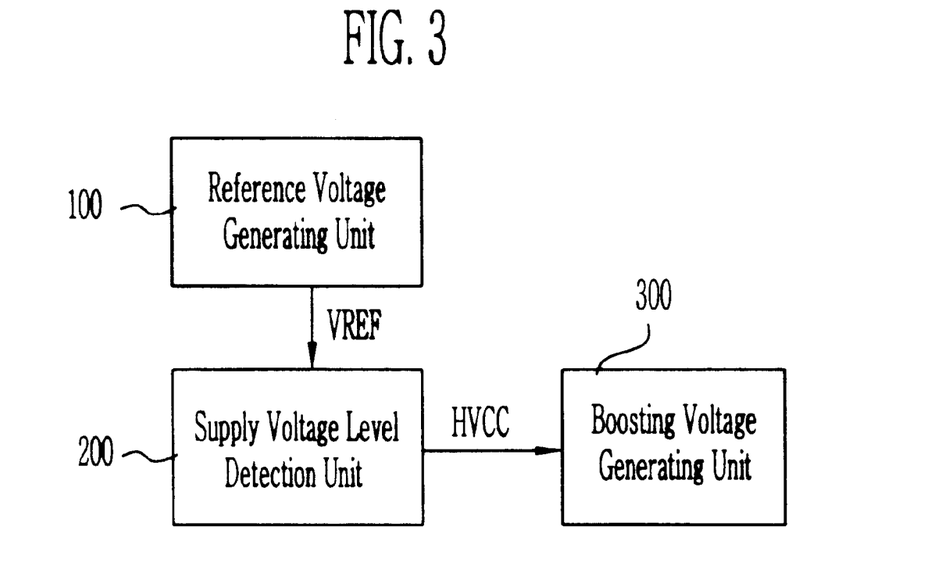
FIG. 3 is a block diagram of a bootstrap circuit according to the present invention.

Referring now to FIG. 3, a bootstrap circuit according to one embodiment of the present invention will be described. The bootstrap circuit comprises a reference voltage generating unit 100 for generating the reference voltage VREF, a supply voltage level detection unit 200 for comparing the reference voltage VREF and a supply voltage Vcc applied to detect a high potential supply voltage HVcc or a low potential supply voltage LVcc, and a boosting voltage generating unit 300 for outputting a boosting voltage Vboot controlled depending on a clamp signal generated by an output signal HVCC of the supply voltage level detection unit 200 to a word line. The reference voltage generating unit 100 includes a reference voltage generator 120 for generating the reference voltage VREF, and a driver 110 for driving the reference voltage generator 120.

Figure 4:
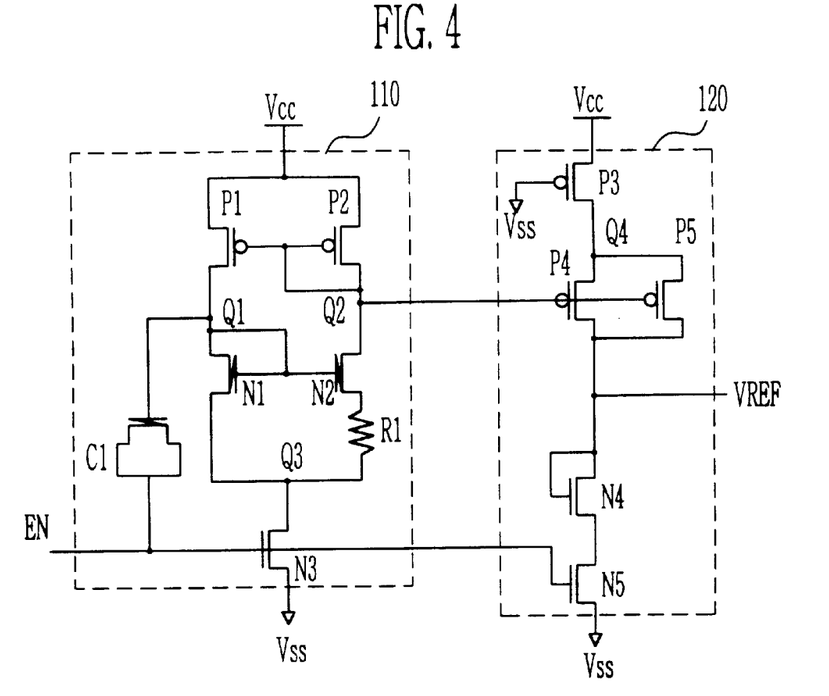
FIG. 4 is a construction of a reference voltage generator in FIG. 3.

The driver 110 includes a first capacitor C1 connected between an enable signal EN source and a first node Q1, and first and second PMOS transistors P1 and P2 connected between the supply voltage Vcc source and the first and second nodes Q1 and Q2 and driven as a current mirror. Also, the drive 110 further includes first and second NMOS transistors N1 and N2 connected between the first and second nodes Q1 and Q2 and the third node Q3 and driven by the current mirror, and a third NMOS transistor N3 connected between the third node Q3 and the ground Vss. Meanwhile, the first and second PMOS transistors P1 and P2 are driven by the potential of the second node Q2, the first and second NMOS transistors N1 and N2 are driven by the potential of the first node Q1 and the third NMOS transistor N3 is driven by the enable signal EN.

The reference voltage generator 120 includes a third PMOS transistor P3 connected between the supply voltage Vcc source and a fourth node Q4, and fourth and fifth PMOS transistors P4 and P5 in parallel connected between the fourth node Q4 and an output terminal for outputting a reference voltage VREF. The reference voltage generator 120 further includes a fourth NMOS transistor N4 connected between the output terminal and the ground Vss and driven by a diode, and a fifth NMOS transistor N5 connected between the fourth NMOS transistor N4 and the ground Vss. Meanwhile, the third PMOS transistor P3 is always driven by the ground Vss, the fourth and fifth PMOS transistors P4 and P5 are driven by the potential of the second node Q2, the fourth NMOS transistor N4 is driven by the reference voltage VREF and the fifth NMOS transistor N5 is driven by the enable signal EN.

Also, the reference voltage generating unit 100 may includes a stabilization means in which a plurality of capacitors are connected in parallel in the output terminal of the reference voltage generator 120 in order to stabilize the reference voltage VREF.

Figure 5:
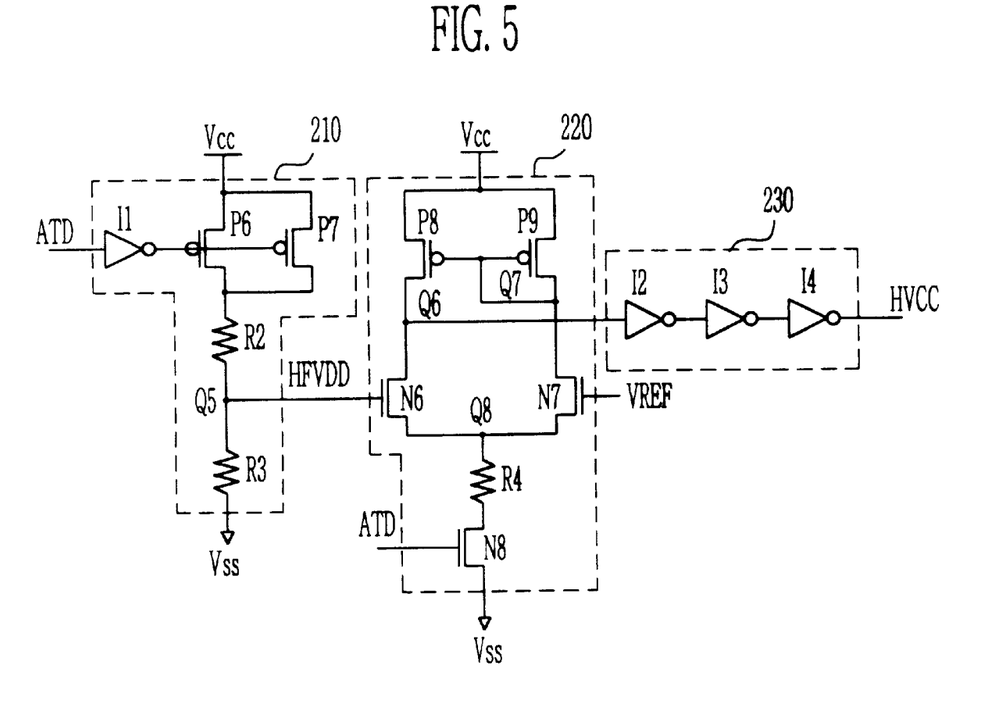
FIG. 5 is a construction of a supply voltage level detector in FIG. 3.

The supply voltage level detection unit 200 includes a supply voltage transfer unit 210 for transmitting the supply voltage Vcc, a comparator 220 for comparing the reference voltage VREF and the output signal HFVDD of the transfer unit 210, and an output unit 230 for receiving the output signal of the comparator 220 to output a clamp signal CLAMP.

The supply voltage transfer unit 210 includes second and third resistors R2 and R3 which are serially connected between the supply voltage Vcc source and the ground Vss between the fifth node Q5, for outputting the output signal HFVDD corresponding to the supply voltage Vcc to the fifth node Q5. At this time, the third resistor R3 has a resistance value higher than the second resistor R2 in order to transmit intact the supply voltage Vcc source to the fifth node Q5.

Also, the supply voltage transfer unit 210 may include a plurality of diodes formed of PMOS or NMOS transistor, for distributing the supply voltage Vcc instead of the second and third resistors R2 and R3 to output the output signal HFVDD.

Further, the supply voltage transfer unit 210 further includes sixth and seventh PMOS transistors P6 and P7 which are connected between the supply voltage Vcc source and the second resistor R2 in parallel and driven by the output signal of the first inverter I1 for inverting an external driving signal ATD.

The comparator 220 includes eighth and ninth PMOS transistors P8 and P9 connected between the supply voltage Vcc source and the sixth and seventh nodes Q6 and Q7 and driven by the current mirror, sixth and seventh NMOS transistors N6 and N7 connected between the eighth node Q8 and the sixth and seventh nodes Q6 and Q7 and driven by a differential amplifier, and a fourth resistor R4 and an eighth NMOS transistor N8 that are serially connected between the eighth node Q8 and the ground Vss. Meanwhile, the eighth and ninth PMOS transistors P8 and P9 are driven by the potential of the seventh node Q7, the sixth NMOS transistor N6 is driven by the output signal HFVDD of the supply voltage transfer unit 210, the seventh NMOS transistor N7 is driven by the reference voltage VREF and the eighth NMOS transistor N8 is driven by the driving signal ATD externally applied.

The output unit 230 includes second~fourth inverters I2~I4 for receiving the output signal from the sixth node Q6 to output the output signal HVCC.

Figure 6:
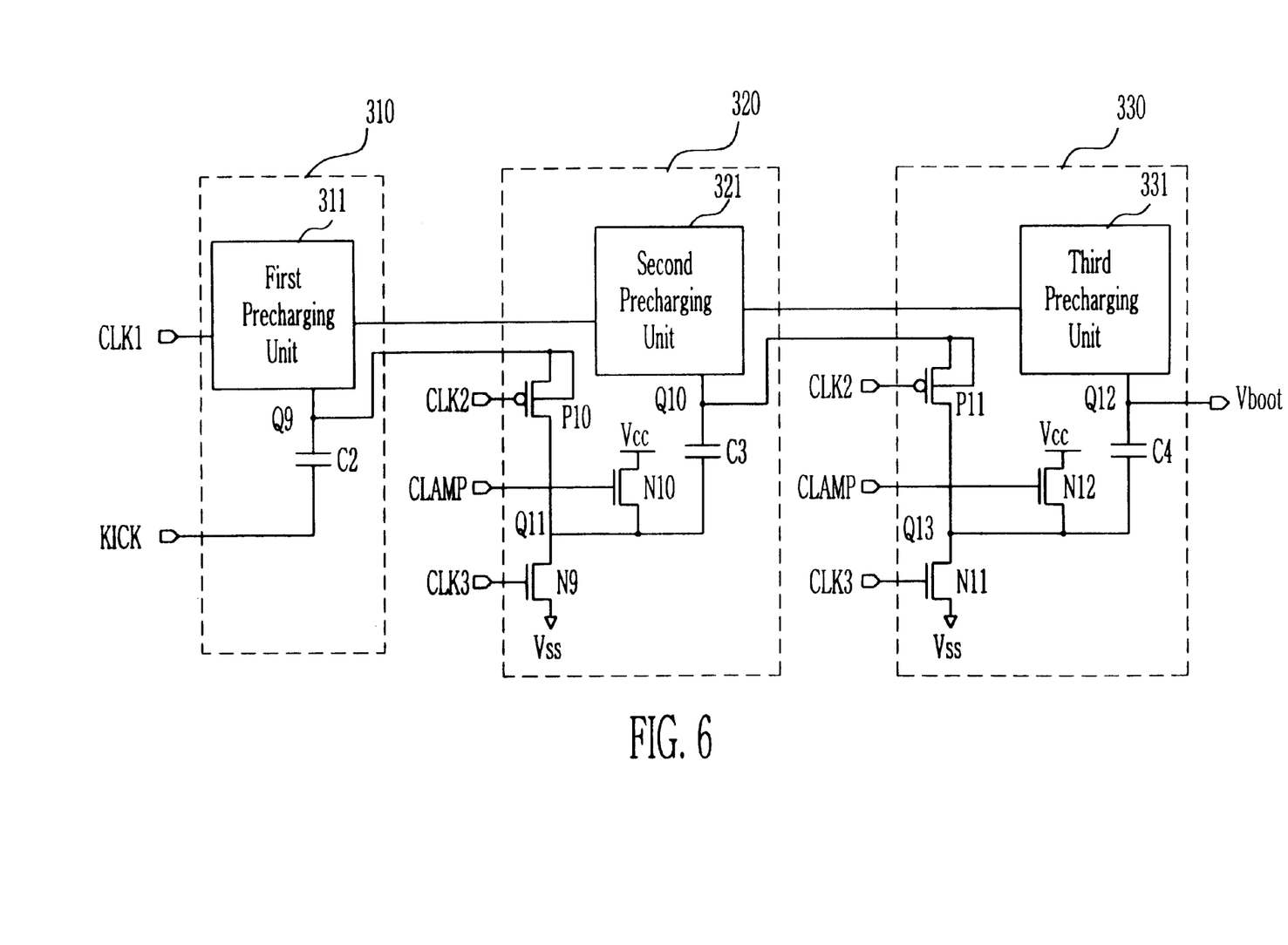
FIG. 6 is a construction of a boosting voltage generator in FIG. 3.

The boosting voltage generating unit 300 includes a first stage 310~a third stage 330 for pumping the word line voltage for boosting the word line over three steps, as shown in FIG. 6.

The first stage 310 includes a first precharging unit 311 driven by the first clock signal CLK, for pre-charging the ninth node Q9 with a given potential Vcc or Vcc–Vt, and a second capacitor C2 connected between the ninth node Q9 and the kick signal KICK, for pumping the ninth node Q9 with the first potential V1.

The second stage 320 includes a second precharging unit 321 driven by the first clock signal CLK1, for precharging the tenth node Q10 with a given potential 'Vcc' or 'Vcc–Vt', a tenth PMOS transistor P10 connected between the ninth node Q9 and the eleventh node Q11 and driven by the second clock signal CLK2, a ninth NMOS transistor N9 connected between the eleventh node Q11 and the ground Vss and driven by the third clock signal CLK3, a tenth NMOS transistor N10 connected between the supply voltage Vcc source and eleventh node Q11 and driven by the clamp signal CLAMP to precharge the eleventh node Q11 with the potential of the supply voltage Vcc, and a third capacitor C3 connected between the tenth node Q10 and the eleventh node Q11 for pumping the tenth node Q10 with the second potential V2.

The third stage 330 includes a third precharging unit 331 driven by the first clock signal CLK1 for pre-charging the twelfth node Q12 with a given potential 'Vcc' or 'Vcc–Vt', an eleventh PMOS transistor P11 connected between the tenth node Q10 and the thirteenth node Q13 and driven by the second clock signal CLK2, an eleventh NMOS transistor N11 connected between the thirteenth node Q13 and the ground Vss and driven by the third clock signal CLK3, a twelfth NMOS transistor N12 connected between the supply voltage Vcc source and the thirteenth node Q13 and driven by the clamp signal CLAMP to pre-charge the thirteenth node Q13 with the potential of the supply voltage Vcc, and a fourth capacitor C4 connected between the twelfth node Q12 and the thirteenth node Q13 for pumping the twelfth node Q12 with the third potential V3.

Figure 7:
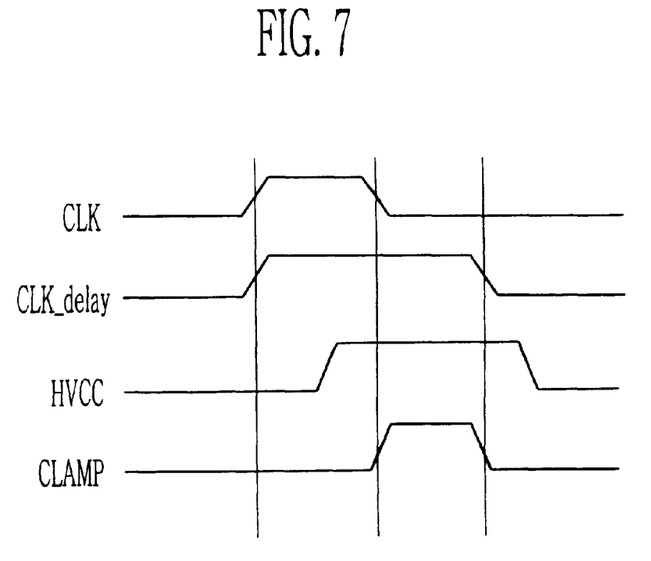
FIG. 7 is a waveform for generating a clamp signal shown in FIG. 6.

At this time, the clamp signal CLAMP is generated by a clamp signal generator (not shown) driven by a waveform shown in FIG. 7.

Explaining in more detail, the clamp signal generator are driven by a given clock signal CLK, a delayed clock signal CLK_delay in which the clock signal CLK is delayed for a given period of time, and the output signal HVCC from the supply voltage level detection unit 200. For example, when the clock signal CLK is at a LOW state and the delayed clock signal CLK_delay is at a HIGH state, the clamp signal CLAMP of a HIGH state is outputted if the output signal HVCC of the supply voltage level detection unit 200 is shifted from a LOW state to a HIGH state.

In other words, the clamp signal generator may be constructed to output the clamp signal CLAMP of an enable state for driving the tenth and twelfth NMOS transistors N10 and N12 when the clock signal CLK is at a LOW state, the delayed clock signal CLK_delay is at a HIGH state and the output signal HVCC of the supply voltage level detection unit 200 is at a HIGH state, or may be constructed to output the clamp signal CLAMP of an enable state at the instant when the output signal HVCC of the supply voltage level detection unit 200 is shifted from a LOW state to a HIGH state. Also, the clamp signal CLAMP is outputted in an enable state to an extent that the clock signal CLK is delayed by the clamp signal generator, that is, that the delayed clock signal CLK_delay and the clock signal CLK.

Also, the tenth NMOS transistor N10 in the second stage and the twelfth NMOS transistor N12 in the third stage may be implemented as a PMOS transistor or a level shift circuit depending on the state of the clamp signal CLAMP.

A driving characteristic of the above mentioned word line bootstrap circuit would be below described in detail.

In the reference voltage generating unit 100, if the enable signal EN of a HIGH state is applied from the outside, the first capacitor C1 of the driving unit 110 is charged with the enable signal EN, the third NMOS transistor N3 is turned on and the fifth NMOS transistor N5 of the reference voltage generator 120 is turned on. Therefore, the third node Q3 maintains the potential of the ground Vss and inputted with the enable signal EN through the first node Q1 or the first capacitor C1, after a given period of time, so that the third node Q3 is shifted to a HIGH state.

Also, as the potential of the first node Q1 is shifted to a HIGH state, the first and second NMOS transistors N1 and N2 driven as a current mirror are turned on, so that the potential of the first and second nodes Q1 and Q2 maintain the potential of the ground Vss. Therefore, as the first and second PMOS transistors P1 and P2 driven as a current mirror are turned on, the same current flows into the first PMOS transistor P1 side same to the second PMOS transistor P2 side so that the first PMOS transistor P1 is driven as a constant current source.

Meanwhile, as the first PMOS transistor P1 is driven as a constant current source, a constant current flows into the first node Q1. As the first and second NMOS transistors N1 and N2 are driven as a current mirror, the same current flows into the second NMOS transistor N2 side same to the first NMOS transistor N1 side. Therefore, as the second NMOS transistor N2 is driven as a constant current source to flow a constant current into the second node Q, the potential of a constant voltage is outputted to the output terminal of the driving unit 110.

Meanwhile, as the fourth node Q4 in the reference voltage generator 120 is always applied with the potential of the ground Vss, it is applied to the supply voltage Vcc through the third PMOS transistor P3 to maintain the potential of the supply voltage Vcc. In this state, as the potential of a constant voltage is applied to the fourth and fifth PMOS transistors P4 and P5 from the second node Q2, the fourth and fifth PMOS transistors P4 and P5 are kept turned on.

Also, a point where the fourth NMOS transistor N4 and the fifth NMOS transistor N5 are connected maintains the potential of the ground Vss since the fifth NMOS transistor N5 is turned on by the enable signal EN. Therefore, as the supply voltage Vcc applied through the third PMOS transistor P3 is distributed centering on the output terminal of the reference voltage generator 120, the reference voltage VREF of a given potential (about 1.2V) is outputted to the output terminal. In other words, the reference voltage VREF is distributed into a given potential depending on the threshold voltage of the third PMOS transistor P3 and the fourth and fifth PMOS transistors P4 and P5 and the threshold voltage of the fourth and fifth NMOS transistors N4 and N5 centering on the output terminal.

Meanwhile, the supply voltage transfer unit 210 in the supply voltage level detection unit 200 distributes the applied supply voltage Vcc into a given potential using the second and third resistors R2 and R3 and outputs the output signal HFVDD corresponding to the voltage applied to both ends of the third resistor R3 through the output terminal. The output signal HFVDD has the potential approximately same to the supply voltage Vcc and is increased in response to the supply voltage Vcc.

Also, the reference voltage VREF outputted through the output terminal in the reference voltage generator 120 is inputted to the seventh NMOS transistor N7 of the comparator 220. Also, the output signal HFVDD from the supply voltage transfer unit 210 is inputted to the sixth NMOS transistor N6 of the comparator 220. Meanwhile, as a driving signal ATM of a HIGH state is inputted to the eighth NMOS transistor N8, the eighth node Q8 is turned on to maintain the potential of the ground Vss.

In this state, if the reference voltage VREF is higher than the output signal HFVDD (i.e., VREF>Vcc), the sixth NMOS transistor N6 is kept turned off while the seventh NMOS transistor N7 is turned on. As the potential of the seventh node Q7 thus maintains the potential of the ground Vss, the eighth and ninth PMOS transistors P8 and P9 are turned on. Therefore, the sixth node Q6 is applied with the supply voltage Vcc the turned on eighth PMOS transistor P8 so that the potential of the supply voltage Vcc can be maintained. Thereafter, the output unit 230 is applied with the potential of the supply voltage Vcc from the sixth node Q6 to output the output signal HVC of a LOW state through the second~fourth inverters I2~I4.

On the contrary, if the output signal HFVDD is higher than the reference voltage VREF (i.e., Vcc>VREF) of the supply voltage Vcc is increased, the sixth NMOS transistor N6 is turned on while the seventh NMOS transistor N7 is turned on. Thus, the sixth node Q6 maintains the potential of the ground Vss. Next, the output unit 230 is applied with the potential of the ground Vss from the sixth node Q6 to output the output signal HVCC of a LOW state through the second~fourth inverters I2~I4.

Figure 8:
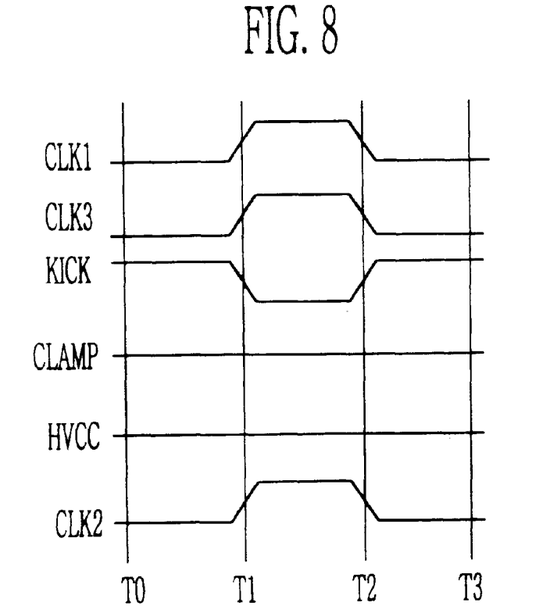
FIG. 8 is a waveform of each of signals inputted to drive the boosting voltage generator shown in FIG. 6 when a low potential supply voltage is applied.
Figure 9:
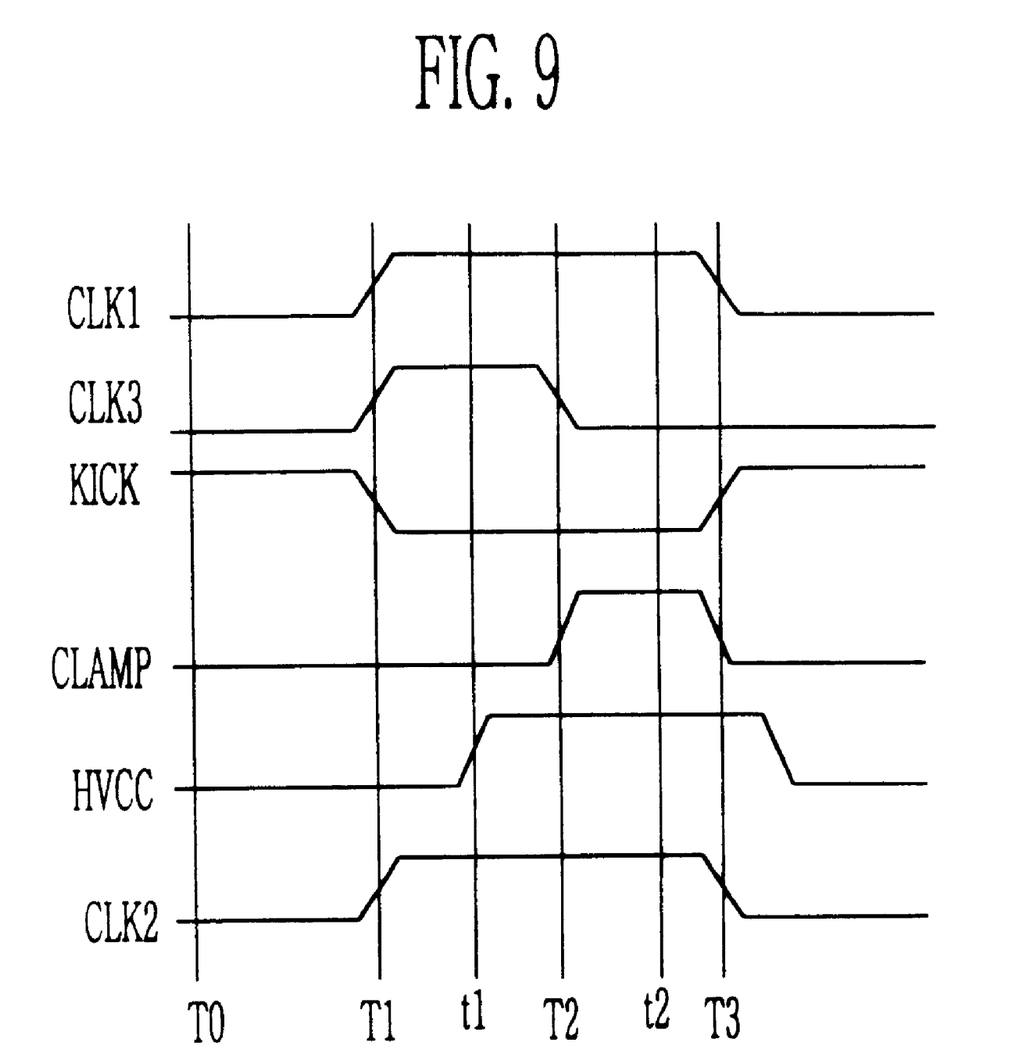
FIG. 9 is a waveform of each of signals inputted to drive the boosting voltage generator shown in FIG. 6 when a high potential supply voltage is applied.

Meanwhile, the boosting voltage generating unit 300 has different driving characteristics depending on the clamp signal CLAMP. This will be below explained by reference to FIG. 8 and FIG. 9. FIG. 8 shows a waveform of each of the signals inputted to respective stages when the supply voltage Vcc is a high potential supply voltage HVcc higher than the reference voltage VREF. FIG. 9 shows a waveform of each of the signals inputted to respective stages when the supply voltage Vcc is a low potential supply voltage LVcc lower than the reference voltage VREF.

As shown in FIG. 8, if the supply voltage Vcc is lower than the reference voltage VREF generated from the reference voltage generating unit 100 (i.e., the supply voltage Vcc is a low potential supply voltage LVcc), the supply voltage level detection unit 200 outputs the output signal HVCC of a LOW state. Thus, the clamp signal CLAMP maintains a LOW state. Therefore, the tenth NMOS transistor N10 of the second stage 320 and the twelfth NMOS transistor N12 of the third stage 330, both constituting the boosting voltage generating unit 300, are kept turned on. As the tenth and twelfth NMOS transistors N10 and N12 are turned off, the boosting voltage generating unit 300 represents the same driving characteristic to the conventional bootstrap circuit.

As shown in FIG. 9, however, if the supply voltage Vcc is higher than the reference voltage VREF (i.e., the supply voltage Vcc is a high potential supply voltage HVcc), the supply voltage level detection unit 200 outputs the output signal HVCC of a HIGH state. After a given period of time, the clamp signal CLAMP maintains a HIGH state. Therefore, as the tenth NMOS transistor N10 of the second stage 320 and the twelfth NMOS transistor N12 of the third stage 330 are turned on, the boosting voltage generating unit 300 represents a different driving characteristic from the conventional bootstrap circuit.

Therefore, if the clamp signal CLAMP is at a LOW state, as the boosting voltage generating unit 300 represents the same driving characteristic to the conventional bootstrap circuit, only a case that the clamp signal CLAMP is at a HIGH state will be described.

Referring now to FIG. 9, during the period from a first time T0 to a second time T1, the first, the second and the third clock signals CLK1, CLK2 and CLK3 is kept at a LOW state and the kick signal KICK is kept at s a HIGH state. Also, the output signal HVCC of the supply voltage level detection unit 200 is kept at LOW state and the clamp signal CLAMP is kept at a LOW state.

In this state, at the second time T1, if the first, the second and the third clock signals CLK1, CLK2 and CLK3 are shifted from a LOW state to a HIHG state and the kick signal KICK is shifted from a HIGH state to a LOW state, in a positive edge where the state is changed to a HIGH state, the first~third pre-charging units 311~331 are driven by the first clock signal CLK1, the tenth and eleventh PMOS transistors P10 and P11 are turned off by the second clock signal CLK2 and the ninth and eleventh NMOS transistors N9 and N11 are turned on by the third clock signal CLK3.

Therefore, a current path is formed between the first precharging unit 311 and the kick signal KICK to precharge the second capacitor C2 with the supply voltage Vcc outputted from the first precharging unit 311, so that the ninth node Q9 is precharged with the potential of the supply voltage Vcc. Also, a current path is formed between the second precharging unit 321 and the ground Vss through the ninth NMOS transistor N9 to precharge the third capacitor C3 with the supply voltage Vcc from the second precharging unit 321, so that the tenth node Q10 is precharged with the potential of the supply voltage Vcc. Also, a current path is formed between the third precharging unit 331 and the ground Vss through the eleventh NMOS transistor N11 to precharge the fourth capacitor C4 with the supply voltage Vcc from the third precharging unit 331, so that the twelfth node Q12 is precharged with the potential of the supply voltage Vcc.

During the period from the second time T1 to a third time T2, as the first~third clock signals CLK1~CLK3 maintain a HIGH state and the kick signal KICK maintains a LOW state, the ninth node Q9, the tenth node Q10 and the twelfth node Q12 maintain the potential of the supply voltage Vcc. Thereafter, at a fifth time t1, if the output signal HVCC of the supply voltage level detection unit 200 is shifted from a LOW state to a HIGH state, at the third time T2, the clamp signal CLAMP is shifted from a LOW state to a HIGH state.

In this state, at the third time T2, if the third clock signal CLK3 is shifted from a HIGH state to a LOW state, the ninth and eleventh NMOS transistors N9 and N11 are turned on and the tenth and twelfth NMOS transistors N10 and N12 are turned off. Thus, the eleventh and thirteenth nodes Q11 and Q13 are precharged with a clamp voltage Vclamp.

During the period from the third time T2 to a fourth time T3, the first and second clock signals CLK1 and CLK2 maintain a HIGH state, the third clock signal CLK3 maintains a LOW state and the clamp signal CLAMP maintains a HIGH state. Therefore, the tenth and twelfth nodes Q10 and Q12 maintain the potential of the clamp voltage Vclamp. Next, at sixth time t2, if the output signal HVCC of the supply voltage level detection unit 200 is shifted from a HIGH state to a LOW state, at the fourth time T3, the clamp signal CLAMP is shifted from a HIGH state to a LOW state.

In this state, at the fourth time T3, if the first and second clock signals CLK1 and CLK2 are shifted to a LOW state and the kick signal KICK is shifted from a LOW state to a HIGH state, the first~third precharging units 311~331 are not driven by the first clock signal CLK1 and the tenth and eleventh PMOS transistors P10 and P11 are turned on by the second clock signal CLK2.

Therefore, the first potential 'V1' on the ninth node Q9 is increased by a potential corresponding to the kick signal KICK. For example, assuming that the potential of the kick signal KICK is 'Vcc' same to the supply voltage Vcc, the first potential 'V1' is increased by '2Vcc'. Then, the second potential 'V2' on the tenth node Q10 is increased by '3Vcc−Vclamp' since the first potential 'V1' is transmitted through the tenth PMOS transistor P10 turned on by the second clock signal CLK2. Also, the third potential 'V3' on the twelfth node Q12 is increased by '4Vcc−2Vclamp' since the second potential 'V2' is transmitted through the eleventh PMOS transistor P11 turned on by the second clock signal CLK2. Therefore, the boosting voltage Vboot outputted to the output terminal in the final word line bootstrap circuit is increased to '4Vcc−2Vclamp'.

As mentioned above, the boosting voltage Vboot, that is outputted to the output terminal in the boosting voltage generator, may be represented by Equation 2.

$$Vboot=\alpha(V2-Vclamp)+Vcc32\ \alpha\{\alpha(V1-Vclamp)+Vcc-Vclamp\}+ \\ Vcc=+^2(\alpha Vcc+Vcc)-\alpha Vclamp+\alpha Vcc-\alpha Vclamp+Vcc=(\alpha^3+\alpha^2+ \\ \alpha+1)Vcc-(\alpha^2+\alpha)Vclamp \quad \text{Equation 2}$$

where 'α' is the coupling ratio of capacitors in respective stages.

If the coupling ratio 'α' of each of the capacitor constituting respective stages is '1', the boosting voltage Vboot is '4Vcc−2Vclamp' according to Equation 2. In other words, if the high potential supply voltage HVcc is applied, the eleventh and thirteenth nodes Q11 and Q13 are precharged with the clamp voltage Vclamp since the clamp signal CLAMP maintains a HIGH state. Thus, the boosting voltage Vboot outputted can be reduced by '2Vclamp' compared to a prior art. Therefore, the amount of the boosting voltage Vboot outputted to the output terminal of the boosting voltage generating unit 300 can be adequately adjusted by controlling the clamp voltage Vclamp.

Figure 10:
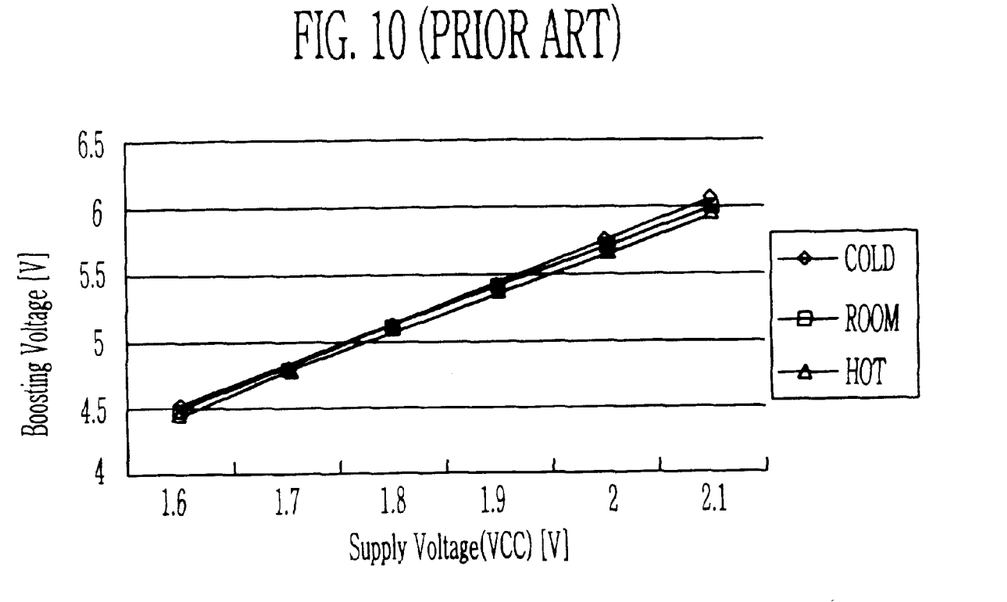
FIG. 10 shows a characteristic of the bootstrap circuit shown in FIG. 1.
Figure 11:
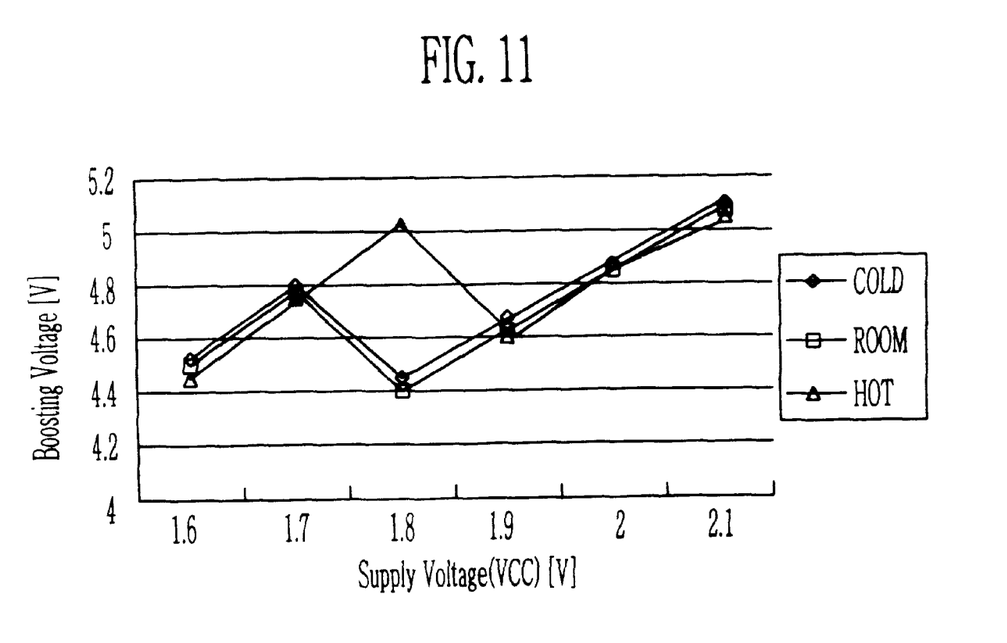
FIG. 11 shows a characteristic of the bootstrap circuit shown in FIG. 3.

Comparison between the characteristics of the bootstrap circuit of the present invention and the conventional bootstrap circuit will be below described by reference to FIG. 10 and FIG. 11. FIG. 10 and FIG. 11 show characteristics of variations in the boosting voltage Vboot a low temperature COLD, a room temperature ROOM and a high temperature HOT depending on variations in the supply voltage Vcc. FIG. 10 illustrate a characteristic of the conventional bootstrap circuit and FIG. 11 illustrate a characteristic of the bootstrap circuit.

Referring now to FIG. 10, it can be seen that the conventional bootstrap circuit outputs the boosting voltage Vboot the level of which is changed from 4.5V to 6V to the output terminal when the supply voltage Vcc is increased from 1.6V to 2.1V. In other words, if the conventional bootstrap circuit is applied with the supply voltage Vcc of 1.6V, the boosting voltage Vboot of 4.5V is outputted to the output terminal. If the conventional bootstrap circuit is applied with the boosting voltage Vboot of 2.1V, the boosting voltage Vboot of 6V is outputted to the output terminal. Therefore, though a target specification of a general word line voltage must be swung within 1V, the swing range of the boosting voltage Vboot in the conventional bootstrap circuit is about 1.5V, which exceeds the target specification range of the word line voltage. Thus, the conventional bootstrap circuit has problems that not only a margin of the word line voltage could not be secured but also the target specification range could not be secured.

On the contrary, it can be seen from FIG. 11 that the bootstrap circuit of the present invention outputs the boosting voltage Vboot the level of which is changed from 4.5V to 5.1V to the output terminal when the supply voltage Vcc is increased from 1.6V to 2.1V. Thus, it can be seen that the swing range of the boosting voltage Vboot in the bootstrap circuit of the present invention is about 0.6V, which is further smaller than the swing range of the boosting voltage Vboot in the conventional bootstrap circuit. This is because at the time when the supply voltage Vcc applied to the bootstrap circuit of the present invention is increased to 1.8V (i.e., at a time where the supply voltage Vcc is increased to the high potential supply voltage HVcc), the voltage of the boosting voltage Vboot such as Equation 2 is dropped by '2Vclamp' as the clamp signal CLAMP is generated from the supply voltage level detection unit. Therefore, the bootstrap circuit of the present invention can obtain a result that the range in variation of the boosting voltage Vboot is improved by 100% compared to the range in variations of the bootstrap circuit.

Also, as mentioned above, the bootstrap circuit of the present invention has different characteristics when the low potential supply voltage LVcc is applied and the high potential supply voltage HVcc is applied. The characteristics will be explained by reference to FIG. 12 and FIG. 13, wherein a waveform 'Ads' represents an address signal for selecting a given memory cell upon a read operation, a waveform 'V1' represents an output voltage of the first stage 310, a waveform 'V2' represents an output voltage of the second stage 320, and a waveform 'Vboot' represents the boosting voltage outputted to the third stage 330.

Figure 12:
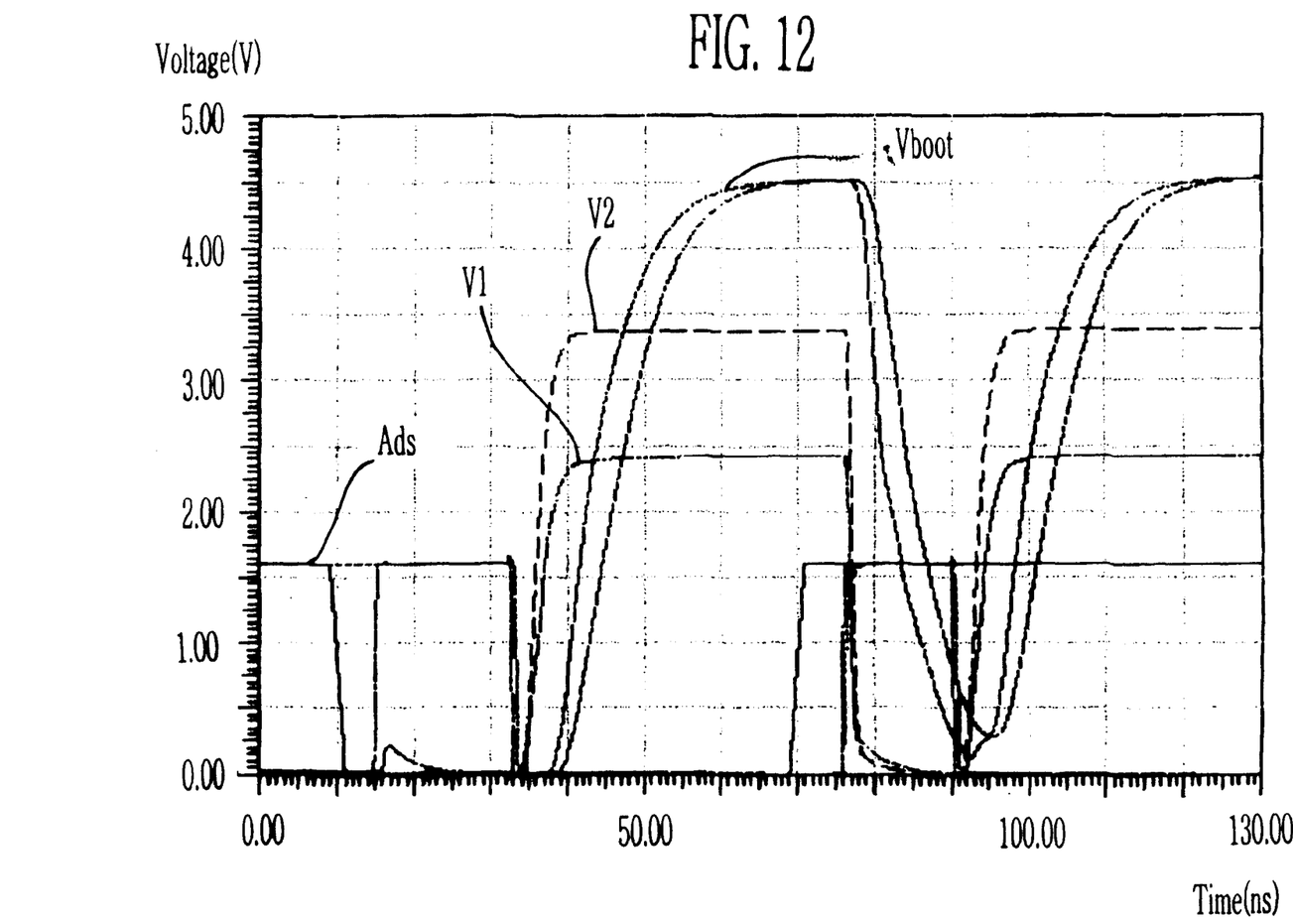
FIG. 12 and FIG. 13 are graphs representing simulation results of the bootstrap circuit shown in FIG. 3.

FIG. 12 is a simulation result when a low potential supply voltage LVcc is applied to the bootstrap circuit of the present invention. As a low potential supply voltage LVcc (i.e., 1.6V) is applied to the bootstrap circuit at room temperature ROOM, the tenth and twelfth NMOS transistors N10 and N12 using the clamp signal CLAMP as an input are not driven, so that a clamping operation is not caused. Therefore, it can be seen that the simulation result in FIG. 12 represents the same driving characteristic to the conventional bootstrap circuit.

Figure 13:
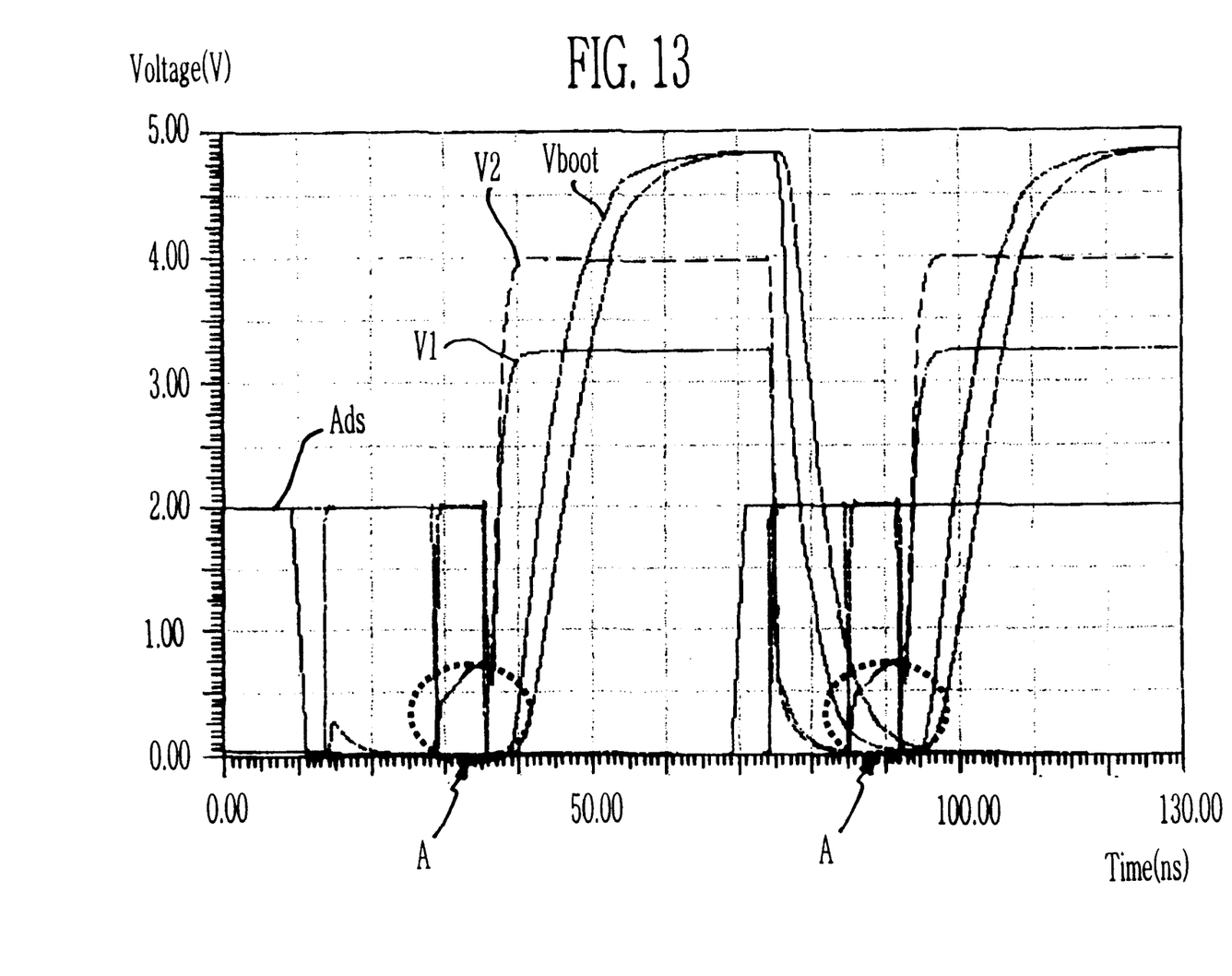

It can be seen from FIG. 13 that the high potential supply voltage HVcc is detected from the supply voltage level detection unit as the high potential supply voltage HVcc (i.e., 2.0V) is applied to the bootstrap circuit in the bootstrap circuit of the present invention, so that a clamping operation is caused to clamp the boosting voltage Vboot by a voltage indicated by 'A'.

As mentioned above, according to the present invention, a bootstrap circuit is constructed to be clamped only at a high potential voltage HVcc and to be normally operated at a low potential voltage source LVcc to easily control on a word line boosting voltage, by sensing the high potential voltage source HVcc and the low potential voltage source LVcc. Therefore, the present invention has an advantage that it can stably perform a read operation of a flash memory cell.

Further, the present invention can improve a cell retention characteristic by reducing a stress applied to the cell due to a high word line voltage at the high potential supply voltage HVcc.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:

1. A bootstrap circuit, comprising:
   a reference voltage generating unit;
   a supply voltage level detection unit for detecting a high potential supply voltage or a low potential supply voltage coupled to the reference voltage unit; and
   a boosting voltage generating unit for controlling the level of a boosting voltage depending on a clamp signal generated by an output signal of said supply voltage level detection unit coupled to the supply voltage level detection unit, wherein the reference voltage generating unit comprises a reference voltage generator, and a driving unit.

2. A bootstrap circuit, comprising:
   a reference voltage generating unit for generating a reference voltage;
   a supply voltage level detection unit for detecting a high potential supply voltage or a low potential supply voltage using said reference voltage;
   a clamp signal generating unit for generating a clamp signal depending on an output signal of said supply voltage level detection unit; and
   a boosting voltage generating unit for controlling the level of a boosting voltage depending on said clamp signal, wherein the reference voltage generating unit includes a reference voltage generator for generating the reference voltage, and a driving unit for driving the reference voltage generator.

3. The bootstrap circuit as claimed in claim 2, wherein said reference voltage generator comprises:
   first and second PMOS transistors in parallel connected between the supply voltage source and an output terminal and driven by the output signal of said driving unit;
   a third PMOS transistor connected between the supply voltage source and said first and second PMOS transistors and driven by a ground signal;
   a first NMOS transistor connected between the output terminal and the ground and driven by the reference voltage; and
   a second NMOS transistor connected between said first NMOS transistor and the ground and driven by an enable signal.

4. The bootstrap circuit as claimed in claim 2, wherein said driving unit comprises:
   a first capacitor connected between the enable signal source and the first node, for charging the enable signal;
   a fourth PMOS transistor connected between said first capacitor and the supply voltage and driven by the potential of the output terminal;
   a fifth PMOS transistor connected between the supply voltage and said output terminal and driven by the potential of the output terminal;
   a third NMOS transistor connected between said fourth PMOS transistor and said second node and driven by the potential of the first node;
   a fourth NMOS transistor connected between the output terminal and said second node and driven by the potential of the first node;
   a first resistor connected between said fourth NMOS transistor and said second node; and
   a fifth NMOS transistor connected between the second node and the ground and driven by the enable signal.

5. The bootstrap circuit as claimed in claim 2, wherein said supply voltage level detection unit comprises:

a supply voltage transfer unit for transferring the supply voltage;

a comparator for comparing the supply voltage and the reference voltage; and an output terminal for outputting the output signal of said comparator.

6. The bootstrap circuit as claimed in claim 5, wherein the supply voltage transfer unit is formed of second and third resistors connected between the supply voltage source and the ground, or wherein the supply voltage transfer unit is formed of first and second diodes serially connected between the supply voltage source and the ground.

7. The bootstrap circuit as claimed in claim 6, wherein said first and second diodes include NMOS or PMOS transistor.

8. The bootstrap circuit as claimed in claim 6, wherein said comparator includes a differential amplifier.

9. The bootstrap circuit as claimed in claim 8, wherein said differential amplifier comprises:

a sixth PMOS transistor connected between the supply voltage source and the output terminal and driven by the potential of said third node;

a seventh PMOS transistor connected between the supply voltage source and the third node and driven by the potential of said third node;

a sixth NMOS transistor connected between the output terminal and the fourth node and driven by the output signal of the supply voltage transfer unit;

a seventh NMOS transistor connected between the third node and the fourth node and driven by the reference voltage;

a fourth resistor connected between the fourth node and the ground; and an eighth NMOS transistor connected between said fourth resistor and the ground.

10. The bootstrap circuit as claimed in claim 5, wherein said output unit comprises:

a first inverter for inverting an output signal of said comparator;

a second inverter for inverting an output signal of said first inverter; and a third inverter for inverting an output signal of said second inverter.

11. The bootstrap circuit as claimed in claim 2, wherein said boosting voltage generator comprises:

a first means for raising the potential of a first output to a first potential depending on a first clock signal and a kick signal;

a second means for raising the potential of a second output node to a second potential depending on a first clock signal, a second clock signal, a third clock signal and said clamp signal; and a third means for raising the potential of a third output node to a third potential depending on said first clock signal, said second clock signal, said third clock signal and said clamp signal.

12. The bootstrap circuit as claimed in claim 11, wherein said first means comprises:

a first precharging unit driven by said first clock signal, for transferring the supply voltage to said first output node; and a second capacitor connected between said kick signal and said first output node.

13. The bootstrap circuit as claimed in claim 11, wherein said second means comprises:

a second precharging unit driven by said first clock signal, for transferring the supply voltage to said second output node;

an eighth PMOS transistor connected between said first output node and said fifth node and driven by said second clock signal;

a ninth NMOS transistor connected between said fifth node and the ground and driven by said third clock signal;

a first clamping means connected between said fifth node and the supply power terminal and driven by said clamp signal, for precharging said fifth node; and a third capacitor connected between said fifth node and said second output node.

14. The bootstrap circuit as claimed in claim 13, wherein said first and second clamping means is formed of a PMOS transistor or a NMOS transistor or of a level shift circuit.

15. The bootstrap circuit as claimed in claim 11, wherein said third means comprises:

a third precharging unit driven by said first clock signal, for transferring the supply voltage to said third output node;

a tenth PMOS transistor connected between said second output node and said sixth node and driven by said second clock signal;

a tenth NMOS transistor connected between said sixth node and the ground and driven by said third clock signal;

a second clamping means connected between said sixth node and the supply power terminal and driven by said clamp signal, for precharging said sixth node; and a fourth capacitor connected between said sixth node and said third output node.

16. The bootstrap circuit as claimed in claim 15, wherein said first and second clamping means is formed of a PMOS transistor or a NMOS transistor or of a level shift circuit.

17. The bootstrap circuit as claimed in claim 2, wherein said clamp signal generating unit is driven by a fifth clock signal in which said fifth clock signal and a fourth clock signal are delayed for a given period of time, and an output signal of said supply voltage level detection unit to output said clamp signal.

18. The bootstrap circuit as claimed in claim 17, wherein said clamp signal is shifted to an enable state at the instant when the output signal of said supply voltage level detection unit is shifted from a LOW state to a HIGH state, in case that said fourth clock signal is at a LOW state and said fifth clock signal is at a HIGH state.

19. The bootstrap circuit as claimed in claim 18, wherein said clamp signal is kept to be an enable state by the difference in said fourth clock signal and said fifth clock signal.

* * * * *